United States Patent
Chang et al.

(10) Patent No.: US 8,832,632 B1
(45) Date of Patent: Sep. 9, 2014

(54) COMPACT ROUTING

(71) Applicants: SpringSoft, Inc., Hsinchu (TW); Springsoft USA, Inc., San Jose, CA (US)

(72) Inventors: Fong-Yuan Chang, Chu-Dong Township (TW); Sheng-Hsiung Chen, Hsinchu (TW)

(73) Assignees: Synopsys Taiwan Co., Ltd., Chupei, Hsinchu Hsien (TW); Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/660,887

(22) Filed: Oct. 25, 2012

Related U.S. Application Data

(60) Provisional application No. 61/552,409, filed on Oct. 27, 2011.

(51) Int. Cl.
  *G06F 17/50* (2006.01)
(52) U.S. Cl.
  CPC .................................. *G06F 17/5077* (2013.01)
  USPC .......................................... 716/130; 716/126

(58) Field of Classification Search
  USPC .................................................. 716/126, 130
  See application file for complete search history.

(56) References Cited

U.S. PATENT DOCUMENTS

| | | | |
|---|---|---|---|
| 2008/0016482 A1* | 1/2008 | Andreev et al. .................. 716/10 |
| 2011/0041111 A1* | 2/2011 | Gao ............................... 716/130 |
| 2011/0041112 A1* | 2/2011 | Kuppuswamy et al. ...... 716/130 |
| 2011/0214100 A1* | 9/2011 | McElvain ...................... 716/130 |
| 2012/0139582 A1* | 6/2012 | Cocchi et al. ................... 326/41 |
| 2012/0144360 A1* | 6/2012 | Smayling et al. ............. 716/119 |

* cited by examiner

*Primary Examiner* — Thuan Do
*Assistant Examiner* — Magid Dimyan
(74) *Attorney, Agent, or Firm* — Kilpatrick Townsend & Stockton LLP

(57) ABSTRACT

Techniques for compacting routing in lower level blocks to free routing resources for upper level blocks are disclosed. In some embodiments, a specification of a hierarchical integrated circuit design comprising a lower level block and an upper level block is obtained. The specification includes an initial routing plan for the lower level block. Subsequently, a compacted routing plan for the lower level block using constrained routing resources comprising fewer routing tracks than the initial routing plan and resulting in at least one unused track as well as a routing plan for the upper level block using the at least one unused track are generated.

20 Claims, 7 Drawing Sheets

COMPACT ROUTING

CROSS REFERENCE TO OTHER APPLICATIONS

This application claims priority to U.S. Provisional Patent Application No. 61/552,409 entitled COMPACT NET ROUTING filed Oct. 27, 2011 which is incorporated herein by reference for all purposes.

BACKGROUND OF THE INVENTION

Integrated circuit design generally comprises two major steps: placement and routing. During the placement step, the positions and orientations of cells and blocks are determined. During the routing step, interconnects or wires are added to connect ports on the placed cells and blocks. Integrated circuit design data is typically partitioned and organized in a design hierarchy. During placement and routing, a design tool may flatten the hierarchy in its internal data structure such that the design is effectively treated as having only two levels in its hierarchy. In such cases, the top level of the design comprises leaf cells, and placement and routing are performed on the leaf cells. Alternatively, in another approach for placement and routing, the design hierarchy may not be internally flattened. Instead, blocks in the design hierarchy are placed and routed individually, with upper level blocks not placed and routed until placement and routing is complete for lower level blocks. In such cases, unconstrained consumption of routing resources during the routing of lower level blocks may result in difficulties in generating a good routing plan for upper level blocks.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims, and the invention encompasses numerous alternatives, modifications, and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

Figure 1A:
FIG. 1A illustrates an example of straight routing between two nodes.
Figure 1B:
FIG. 1B illustrates an example of non-straight routing between two nodes.

Bends or jogs in a routing plan are undesirable. Rather, straight routing is typically preferred. FIG. 1A illustrates an example of straight routing between two nodes, and FIG. 1B illustrates an example of non-straight routing between the same two nodes. Conventional routing approaches start with the routing of lower level blocks without taking into consideration the routing of upper level blocks and thus often result in non-straight routings in upper level blocks.

Figure 2A:
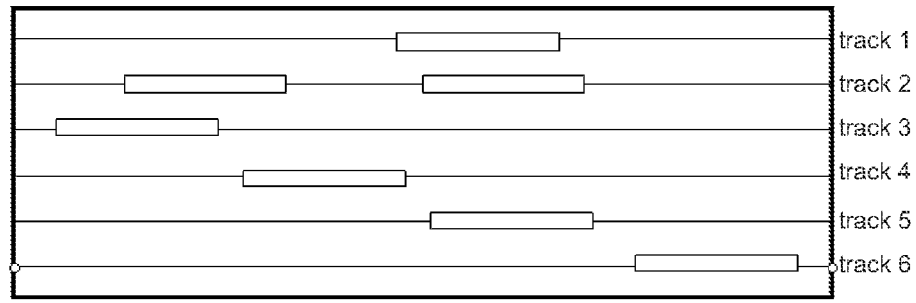
FIGS. 2A-2C illustrate an example of routing an integrated circuit design using a conventional routing approach.
Figure 2B:
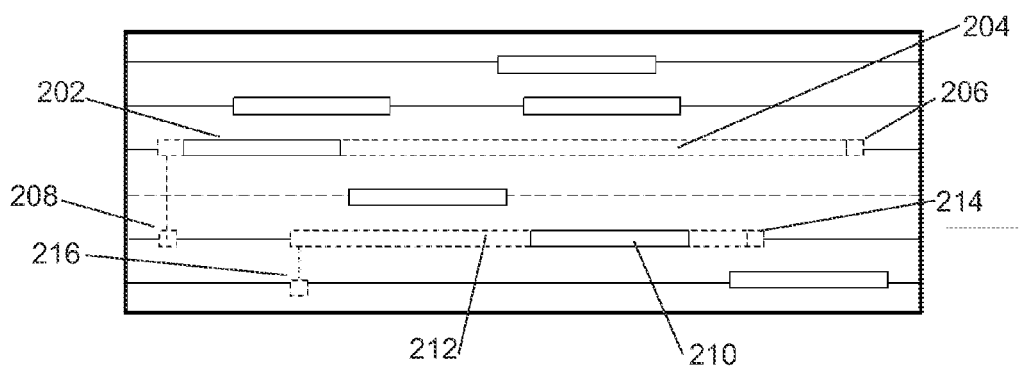
Figure 2C:
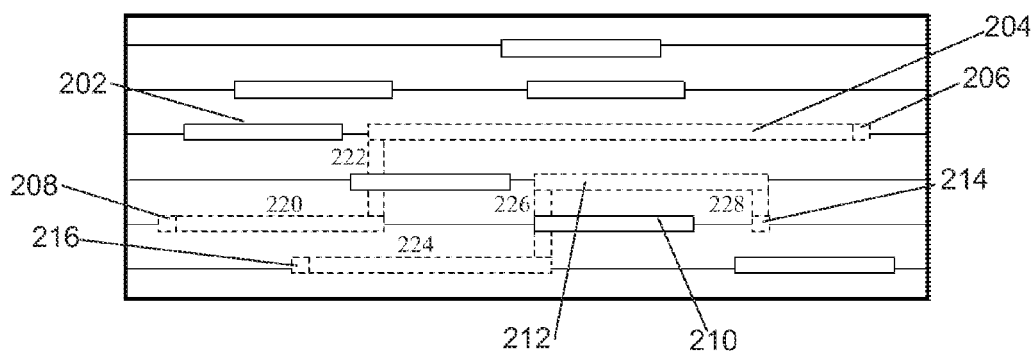

FIGS. 2A-2C illustrate an example of routing an integrated circuit design using a conventional routing approach. In this and other figures of the given disclosure, routing tracks available to a router are present only conceptually but are visually represented by horizontal lines in the given figures to facilitate the discussion; and true wires that a router may generate are represented by rectangles. As depicted, the routing plan in the example of FIGS. 2A-2C employs six tracks. FIG. 2A illustrates wires generated during routing of a lower level block. FIG. 2B illustrates a routing plan for a corresponding upper level block that runs on top of the routing plan of FIG. 2A. As shown in FIG. 2B, wire 204 may be used to connect port 206 and port 208, and wire 212 may be used to connect port 214 and port 216. However, wire 204 overlaps wire 202, which is part of the lower level block and was laid out during the routing of the lower level block. Likewise, wire 212 overlaps wire 210, which is also a part of the lower level block. Since the routing of the lower level block is fixed as depicted in FIG. 2A before the routing of the upper level block, bends or jogs need to be introduced with respect to wire 204 and wire 212 in the upper level block to avoid overlapping of wires. FIG. 2C illustrates an example of a viable routing plan for the upper level block. As depicted, wire 204 is shortened to clear the space occupied by wire 202, and wires 220 and 222 are generated to complete the connection between port 206 and port 208. Wire 212 is not only shortened but also relocated to a different track, and wires 224, 226, and 228 are generated to complete the connection between port 214 and port 216. As depicted in the example of FIGS. 2A-2C, conventional routing approaches often result in non-straight routing in upper level blocks due to limited routing resources remaining available after routing of lower level blocks.

Techniques for generating compact and straight routings for an integrated circuit design are disclosed. As described, in some embodiments, routing resources are at least in part constrained during the routing of lower level blocks in order to achieve improved routing plans for upper level blocks. That is, the described techniques facilitate straight routings or routings with fewer jogs in upper level blocks. In some embodiments, the number of tracks used in the routing of lower level blocks is minimized or at least reduced to the extent possible so that unused tracks remaining after the routing of lower level blocks are available for routing of upper level blocks. In some such cases, a minimum number of routing tracks needed for a lower level block is determined and routing blockage constraints are intelligently inserted to determine if routing can be achieved using only the minimum number of routing tracks. If routing cannot be achieved using only the minimum number of routing tracks, routing blockage constraints are iteratively relaxed, allowing more routing tracks to be used, and routing is reattempted. The process is iterated until routing is successfully achieved. Any unused or freed-up routing tracks may then be employed for routing purposes in upper level blocks. The described techniques not only improve the likelihood of achieving straight routings in upper level blocks but also a better overall routing plan for the chip as a whole. Although many of the given examples describe two levels, the disclosed techniques may be extended, as applicable, to a design comprising any number of levels. Moreover, although the given examples describe horizontal routing, the disclosed techniques may be similarly employed for vertical routing.

Figure 3A:
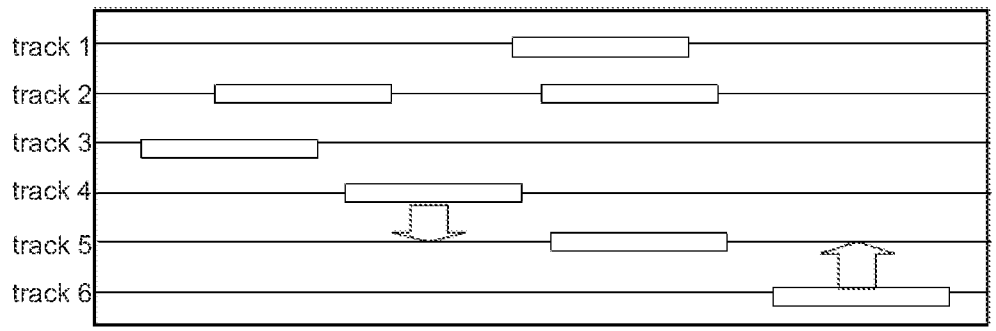
FIGS. 3A-3C illustrate an example of a routing plan comprising straight routings generated using disclosed techniques.
Figure 3B:
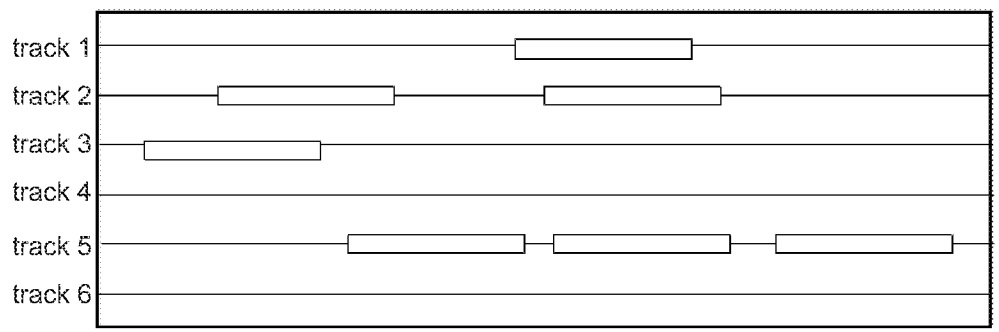
Figure 3C:
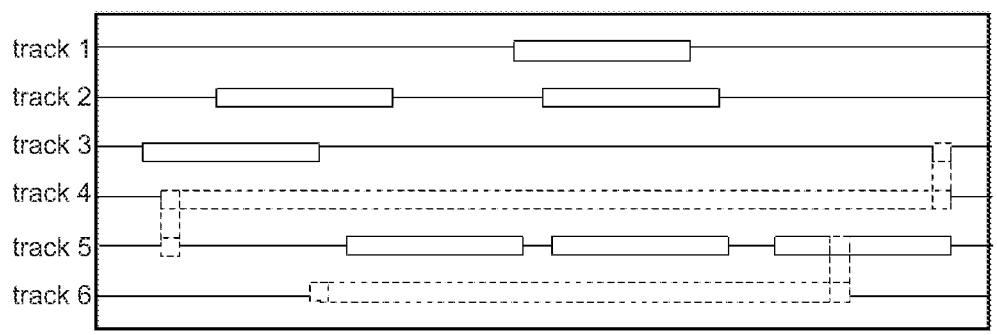

The example of FIGS. 2A-2C illustrates how prior art techniques may generate non-straight routings. FIGS. 3A-3C illustrate routing of the same example using disclosed techniques which results in straight routings. FIG. 3A illustrates an embodiment of a manner in which the routing plan of FIG. 2A may be compacted. The arrows of FIG. 3A indicate that the wires on track 4 and track 6 can be moved to track 5 to minimize or at least reduce the number of tracks used for the routing of the lower level block. The resulting lower level block routing after moving the wires as indicated in FIG. 3A is illustrated in FIG. 3B. In this example, track reduction during lower level routing completely frees two tracks—track 4 and track 6. As a result of the compaction, three wires occupy track 5, and the total number of tracks used for the routing of this lower level block is reduced from six to four, leaving track 4 and track 6 completely free for upper level routing. FIG. 3C illustrates a routing plan for the corresponding upper level block. As depicted, the freed tracks allow straight routings in the upper level block. That is, connections between the same ports as described with respect to FIGS. 2B-2C are achievable using single, straight horizontal wires.

Figure 4A:
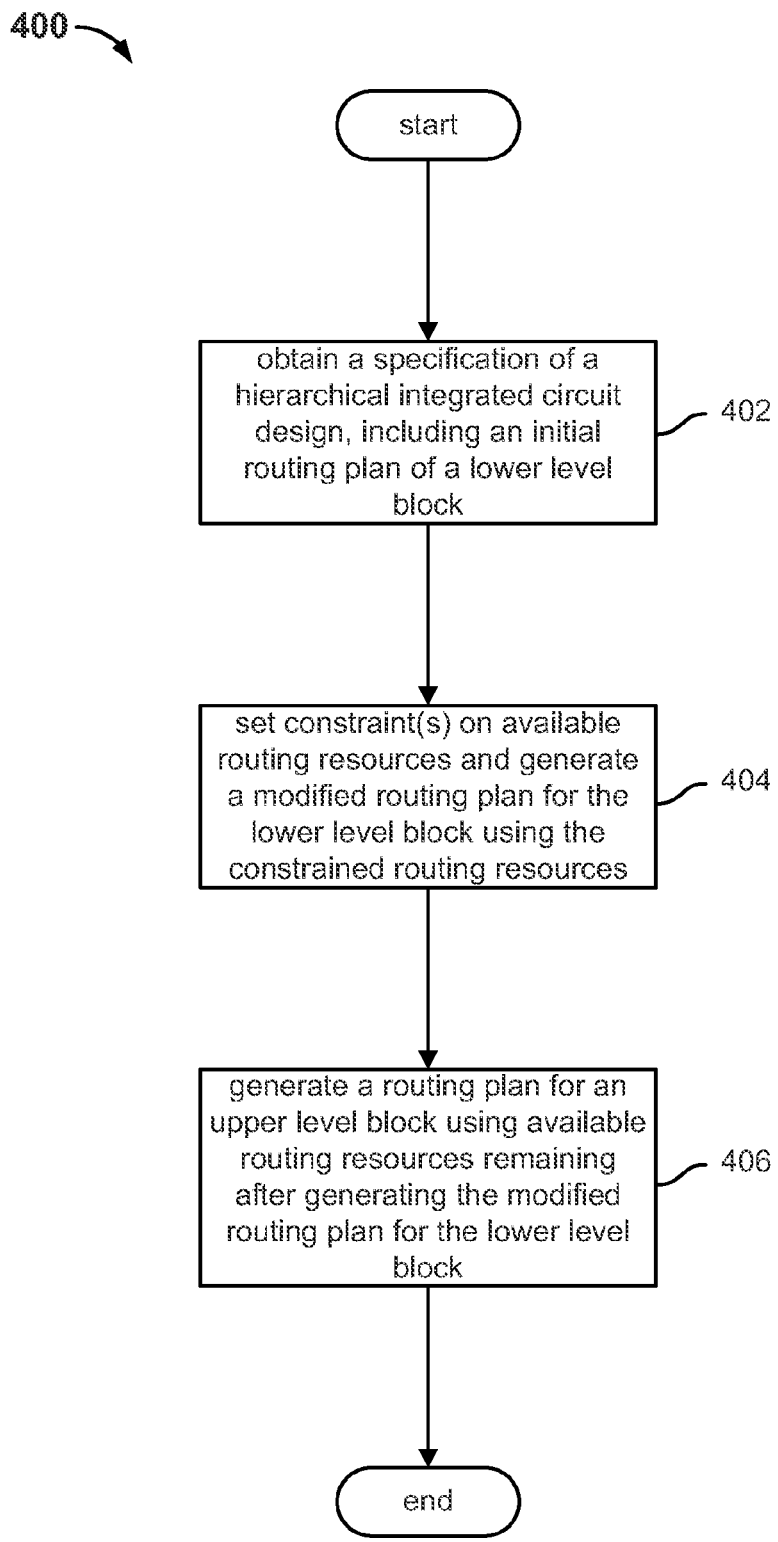
FIG. 4A is a flow chart illustrating an embodiment of a process for generating improved routing.

FIG. 4A is a flow chart illustrating an embodiment of a process for generating compact routing using a reduced number of tracks. For example, process 400 may be employed to generate the routings of FIGS. 3 and 5. Process 400 starts at step 402 at which a specification of a hierarchical integrated circuit design is obtained. The hierarchical integrated circuit design comprises at least one lower level block and at least one upper level block as well as a set of available routing resources (e.g., routing tracks) for routing the blocks comprising the design. In some embodiments, the specification received at step 402 includes an initial routing plan for a lower level block. Such an initial routing plan may be generated without imposing constraints on available routing resources. In some embodiments, the initial routing plan may not comprise a complete routing plan, i.e., may comprise a partial routing plan. For example, the initial routing plan may not comprise all needed contact cuts. Moreover, if the objective of compacting is to free tracks in one dimension (e.g., horizontal or vertical), the initial routing plan may not comprise routing in the other dimension (e.g., vertical or horizontal). At step 404, a set of one or more constraints on available routing resources are set, and a modified routing plan is generated for the lower level block using the constrained routing resources. In some cases, the available tracks for routing the lower level block are constrained to a subset of all available tracks, and the modified routing plan employs fewer tracks than the initial routing plan. Thus, the modified routing plan comprises a more compact routing than the initial routing plan. Any unused or freed tracks remaining after generating the modified routing plan for the lower level block are completely available for routing upper level blocks. At step 406, a routing plan is generated for an upper level block using available routing resources remaining after generating the modified routing plan for the lower level block at step 404. The routing plan generated for the upper level block may employ one or more tracks that were unused or freed at step 404. Generating a more compact routing plan for a lower level block at step 404 facilitates routing resources for generating straight routings to remain available for the routing of an upper level block at step 406. Although described for a single lower level block and a single upper level block, process 400 may be systematically employed for a hierarchical integrated circuit design comprising any number of levels. Any appropriate router may be employed to generate the routing plans described with respect to process 400.

Figure 4B:
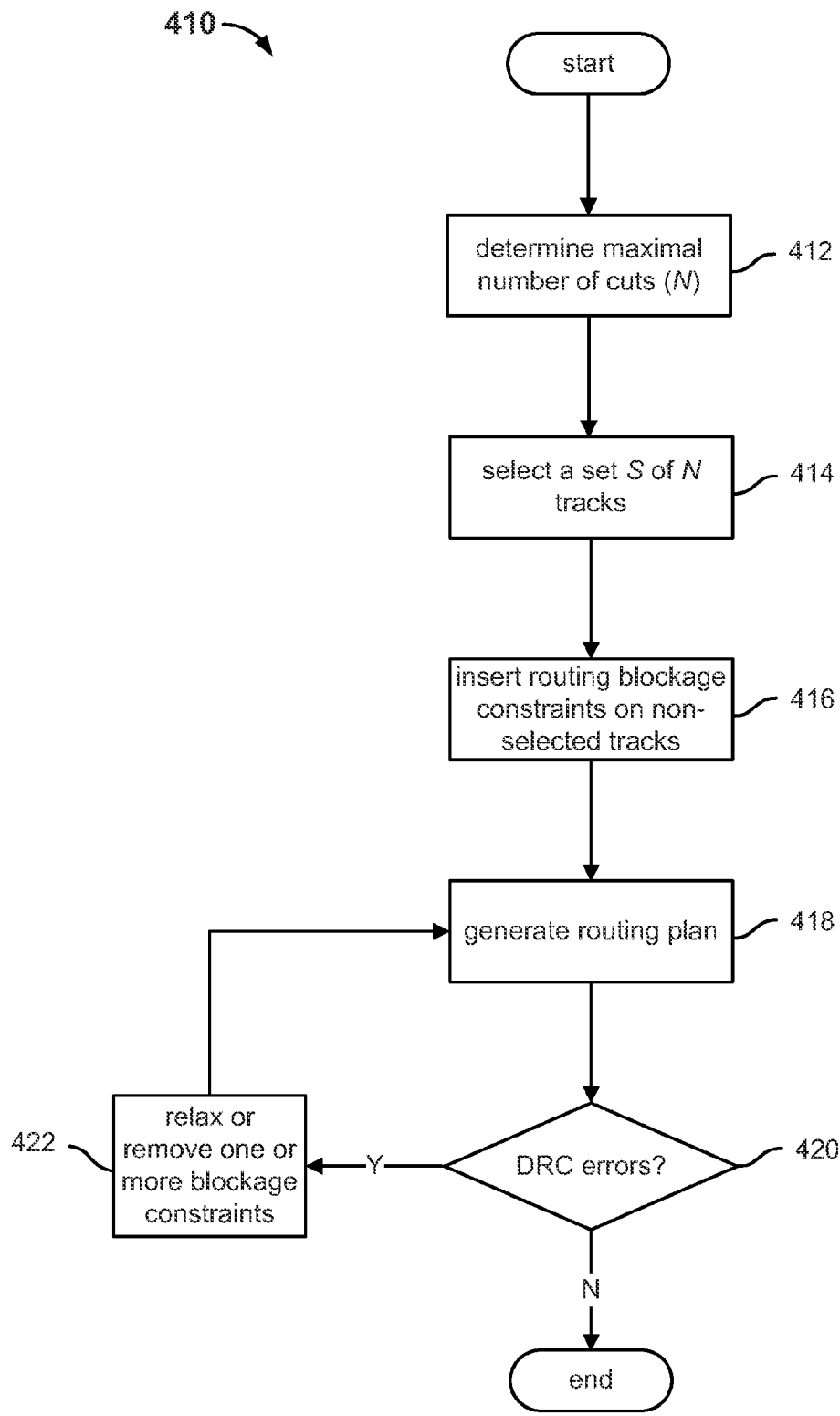
FIG. 4B is a flow chart illustrating an embodiment of a process for generating compact routing using a reduced number of tracks.

FIG. 4B is a flow chart illustrating an embodiment of a process for generating compact routing using a reduced number of tracks. In some embodiments, process 410 is employed at step 404 of process 400 of FIG. 4A. Process 410 starts at step 412 at which a maximal number of cuts N across a set of tracks of a block under consideration is determined. That is, columns perpendicular to the routing tracks are scanned to identify places where the number of parallel wires intersecting the columns is at a maximum. It can be theoretically proved that the maximal number of cuts N of a block under consideration is a lower bound for the number of tracks needed to route the block. Thus, a number of tracks equal to the maximal number of cuts N is employed as a starting point for routing the block. At step 414, a set S of N tracks is selected. That is, given a total set T of M tracks, a subset S of N tracks is selected at step 414 for routing the block under consideration. Any set S of N tracks may be selected at step 414. In some cases, a set S of N tracks is arbitrarily selected at step 414. In some cases, any set of tracks that contain the maximal number of cuts is selected at step 414. In some cases, a more intelligent algorithm may be employed to select the set S of N tracks at step 414.

In some embodiments, modified k-means clustering is employed at step 414 to select the set S of N tracks based on a cost function. In one embodiment, for example, an initial set $S_i$ of $N_i$ tracks is selected, e.g., arbitrarily or that contain the maximal number of cuts. Next, the total set T of M tracks is partitioned into groups, with each group including at least one track from S. For each group, a mean or center of gravity track is identified. The displacement of moving each wire in a given group to the center of gravity track of the group is determined. The displacements across all groups are summed to yield a total displacement cost for a given partition. By varying the number of groups from 1 to N and trying different possible partitions for any given number of groups, a partition with a low or the lowest total displacement cost can be identified and selected. For each group in the selected partition, the number of tracks that come from $S_i$ is determined and that many tracks starting with the center of gravity track are selected for S. In some cases, if multiple tracks are selected for a given group, additional tracks adjacent to the center of gravity track and/or that come from $S_i$ are selected. The selected set of tracks across all groups of the selected partition comprises the set S of N tracks of step 414. In various embodiments, the final set S may or may not be the same as the initial set $S_i$. Mathematically, this technique for selecting the set S of N tracks is similar to k-means clustering with the following modifications: (1) although the sampling space is $S_i$, all tracks in a given group are employed to determine the mean or center of gravity track of the group and (2) the cost function includes the sum of displacements of moving all wires in a group to the track at or near the center of gravity of the group.

In some embodiments, the cost function takes into consideration preferred tracks or preferred routing areas in addition to wire displacement costs. In some cases, one or more tracks that are preferred as initial routing resources may be first selected. For example, tracks that are partially used by hard macros may be preferred as initial routing resources. Since the contents of a macro cannot be altered, any track that is partially used by a macro cannot be entirely freed for upper level routing purposes and thus may be preferred for use during lower level routing to the extent possible, for example, so that more completely unused tracks may be saved for upper level routing. Alternatively, preferred tracks and/or routing areas for a block under consideration may be identified and specified, for example, by a user or routing algorithm. The aforementioned cost function may be modified or revised to take into account preferred tracks or preferred routing areas in addition to wire displacement costs. In some embodiments, positive or negative weights are assigned to the displacement term and the preferred track term, and the two terms are combined in the cost function. For example, a cost function F may be defined as follows: $F=W_D*$displacements+$W_P*$preferred-tracks. In this example, $W_D$ is the weight assigned to the displacement term, $W_P$ is the weight assigned to the preferred track term, displacements is the sum of displacements for moving wires in each group to the center of gravity track of the group, and preferred-tracks is the number of tracks selected (e.g., from the center of gravity) that are also preferred tracks or intersect preferred routing areas. Although some examples of a cost function have been described, in other embodiments, any other appropriate cost function may be employed.

After the set S of N tracks is selected at step 414 of process 410, routing blockage constraints are inserted to block or mask all non-selected tracks at step 416. A blockage constraint indicates a forbidden zone that cannot be used by a router for routing of a current block. Ideally, the set S of N tracks is sufficient for completing the routing for the block under consideration. Thus, the N tracks in S are employed as initial routing resources, and routing blockage constraints are inserted to block out all other tracks T-S. At step 418, a routing plan for the block under consideration is generated, e.g., by a router, using allowed routing resources. In some cases, DRC (Design Rule Checking) violations, such as wire overlapping, are allowed during the routing of step 418. In such cases, step 418 comprises routing using allowed tracks without violating blockage constraints but permitting DRC violations if unavoidable. That is, the router generates a routing plan for all nets comprising the block under consideration using only allowed tracks even though the resulting routing plan may comprise DRC violations such as wire overlapping. At step 420, it is determined whether the routing plan generated at step 418 includes any DRC errors. If it is determined at step 420 that DRC errors exist, one or more blockage constraints inserted at step 416 are removed or relaxed at step 422, allowing one or more previously blocked tracks to be used for the routing of the block under consideration. In some cases, a blockage constraint adjacent to or near the location of a DRC error and/or an associated center of gravity track is removed, e.g., with the expectation that using the resulting unblocked track during routing will eliminate the DRC error. Subsequently, process 410 returns to step 418 at which a new routing plan is generated for the block under consideration using the expanded set of allowed routing resources. That is, the block is re-routed using more tracks than the previous iteration. Steps 418-422 may be repeated or iterated one or more times until a routing plan for the block under consideration is generated that does not include any DRC errors. In some cases, a single blockage constraint is removed and a corresponding track made available for routing during each iteration of step 422. Alternatively, in other cases, multiple blockage constraints may be removed and corresponding tracks made available for routing during each iteration of step 422. Process 410 ends when it is determined at step 420 that a generated routing plan does not include any DRC errors. In many cases, the routing plan for the block under consideration resulting from process 410 comprises a minimal or at least reduced number of tracks. In a worst case scenario, process 410 iterates until all blockage constraints are removed. In such cases, more compact routing (i.e., a reduction in the number of tracks employed) for the block under consideration is not possible, e.g., since the initial routing of the block (e.g., as received at step 402 of process 400) is already in its most compact form.

Figure 5A:
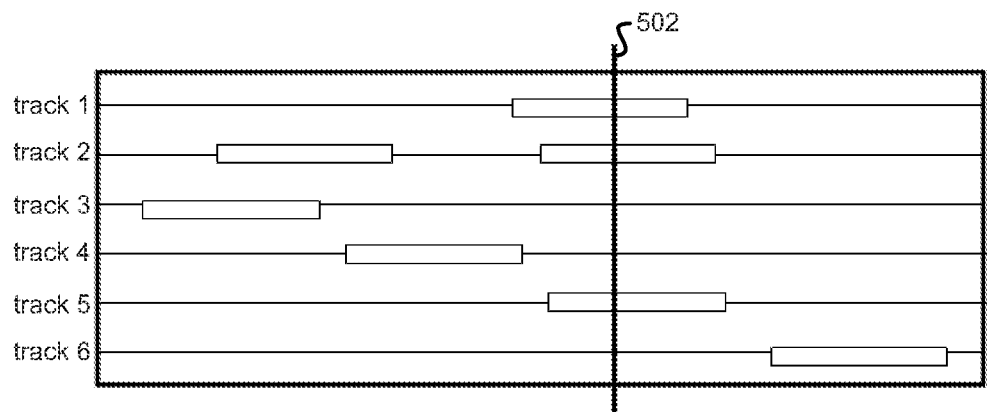
FIGS. 5A-5F illustrate an example of generating a compact routing plan for a block.

FIGS. 5A-5F illustrate an example of generating a compact routing plan for a block. For example, processes 400 and 410 of FIGS. 4A-4B may be employed to generate the compact routing plan. FIG. 5A illustrates wires generated during routing of a lower level block. For example, the routing plan may be generated by a router without imposing constraints on available routing resources. In FIG. 5A, columns perpendicular to the routing tracks are scanned to identify the maximal number of cuts. Column 502 represents a column that is cut or intersected by a maximal number of wires. A maximal number of wires may intersect a plurality of columns and be located on one or more different sets of tracks. In the given example, a maximal number of cuts of the scanned columns is three, and the wires associated with the maximal number of cuts are located on track 1, track 2, and track 5. A more compact routing of the block is attempted starting with a set S of three tracks. In one example, set S is selected to include the tracks having wires corresponding to a maximal number of cuts, i.e., track 1, track 2, and track 5.

Figure 5B:
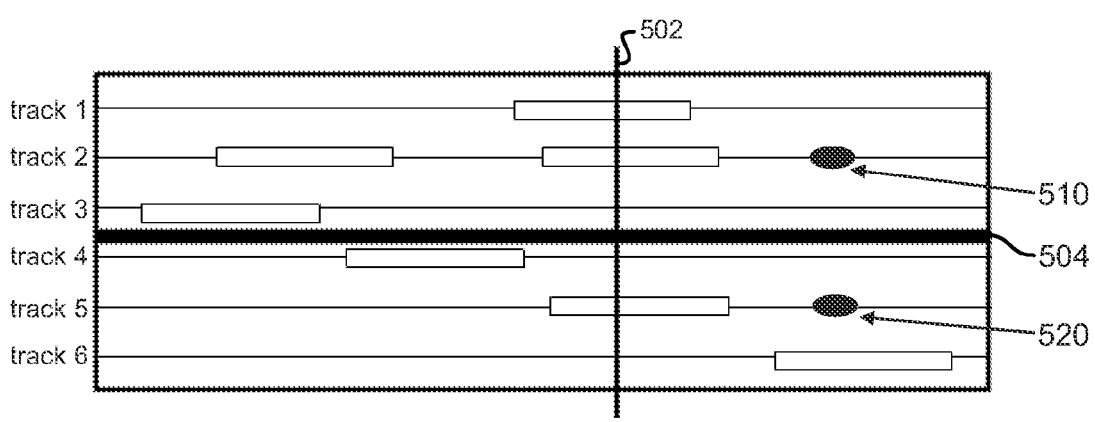

FIG. 5B illustrates one example of a manner in which a modified k-means algorithm may be employed to obtain the set S. In the given example, an initial set $S_i$ includes the tracks comprising the maximal number of cuts, i.e., track 1, track 2, and track 5. A plurality of group partitions of the set T of all tracks may be considered before choosing a selected partition that corresponds to a least or at least a low displacement cost. The selected partition 504 in the example of FIG. 5B comprises two groups, with each group including three tracks and at least one track from $S_i$. A first group includes track 1, track 2, and track 3, with two tracks—track 1 and track 2—from $S_i$. A second group includes track 3, track 4, and track 5, with one track—track 5—from $S_i$. The displacement cost for the first group is the sum of the displacements for moving the wire on track 1 and the wire on track 3 to track 2, the center of gravity 510 for the first group. Likewise, the displacement cost for the second group is the sum of displacements for moving the wire on track 4 and the wire on track 6 to track 5, the center of gravity 520 for the second group. Since the first group includes two tracks from $S_i$, two tracks for S are selected from the first group, starting with the center or gravity, track 2. A second track—track 1—that is adjacent to the center of gravity track and in this case is also included in $S_i$ is selected for S from the first group. Since the second group includes one track from $S_i$, a single track for S—the center of gravity, track 5—is selected for S from the second group. Thus, track 1, track 2, and track 5 are selected for S. Although in this example $S_i$ and S are the same, in other embodiments S may be different from $S_i$.

Figure 5C:
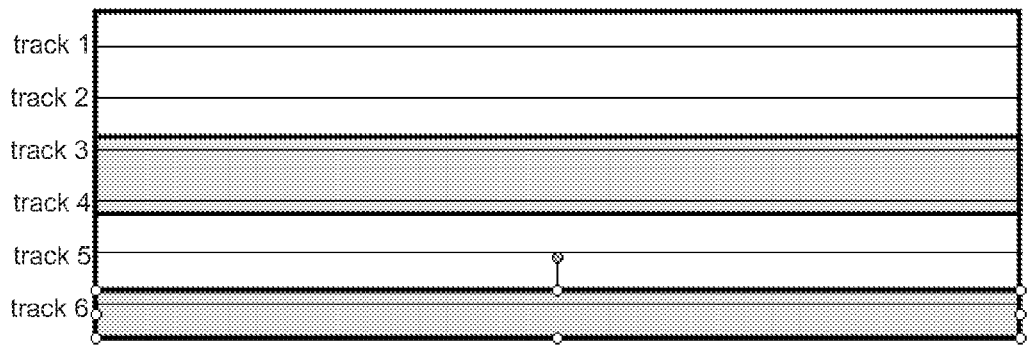
Figure 5D:
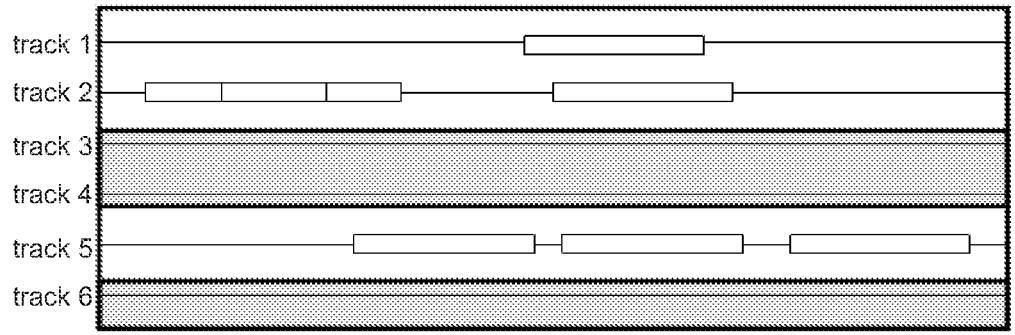
Figure 5E:
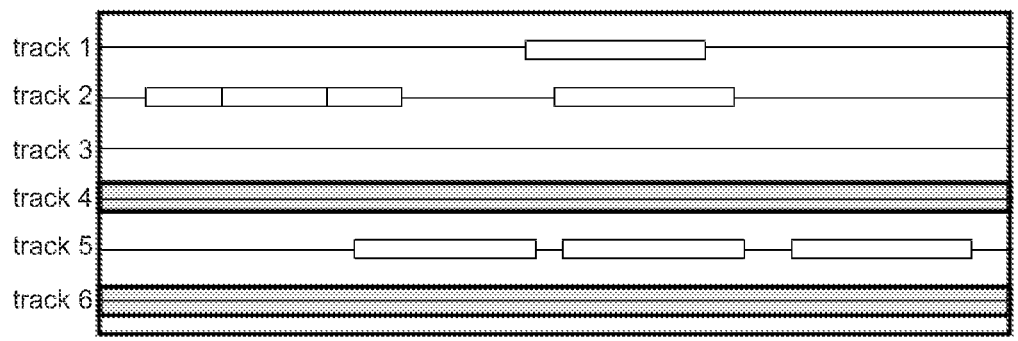
Figure 5F:
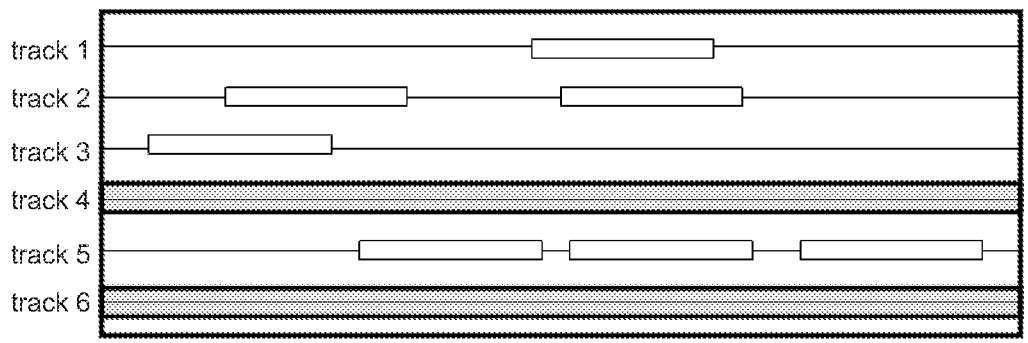

Blockage constraints are inserted on all tracks T-S (i.e., track 3, track 4, and track 6) as illustrated in FIG. 5C so that the tracks are not available during routing. Routing of the block is attempted using only the tracks comprising S, and a resulting routing plan is illustrated in FIG. 5D. As depicted, the wires that were on track 4 and track 6 are moved to track 5. Moreover, the wire on track 3 is moved to track 2, which results in a wire overlapping DRC error. In an attempt to eliminate the DRC error, a routing blockage constraint adjacent to the location of the DRC error is removed as illustrated in FIG. 5E, i.e., the routing blockage constraint of track 3 is removed. Routing of the block is re-attempted with track 1, track 2, track 3, and track 5. With one more track available for routing, a routing plan without any wire overlapping and other DRC errors is feasible as illustrated in FIG. 5F. In this example, compacting the starting routing plan of FIG. 5A results in the routing plan of FIG. 5F in which two tracks—track 4 and track 6—have completely been freed for routing of upper level blocks.

The aforementioned techniques for compacting routing may be applied to lower level blocks of an integrated circuit design so that freed tracks can be employed for routing upper level blocks that instantiate the lower level blocks. The described techniques may be applied recursively from bottom to top in an integrated circuit hierarchy. Routing lower level blocks more compactly improves the likelihood of achieving straight routings in upper level blocks.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system configured to:
   obtain a specification of a hierarchical integrated circuit design comprising a lower level block and an upper level block when the system is invoked to route the hierarchical integrated circuit design, wherein the specification comprises a first routing plan associated with the lower level block;
   modify the first routing plan using constrained routing resources so as to generate a second routing plan associated with the lower level block, the second routing plan comprising fewer routing tracks than the first routing plan and resulting in at least one unused track; and
   generate a third routing plan associated with the upper level block using the at least one unused track.

2. The system of claim 1, wherein the specification includes a specification of available routing resources.

3. The system of claim 1, wherein the first routing plan is generated without imposing constraints on available routing resources.

4. The system of claim 1, wherein using the at least one unused track facilitates a straight routing in the upper level block.

5. The system of claim 1, wherein the constrained routing resources comprise a set of allowed routing tracks that is a subset of a set of all available routing tracks.

6. The system of claim 5, wherein the set of allowed routing tracks comprises a minimum number of routing tracks associated with routing the lower level block.

7. The system of claim 5, wherein a number of tracks in the set of allowed routing tracks is equal to a maximal number of parallel wires in the set of all available routing tracks that intersects a line perpendicular to the set of all available routing tracks.

8. The system of claim 5, wherein the set of allowed routing tracks includes tracks comprising a maximal number of parallel wires in the set of all available routing tracks that intersects a line perpendicular to the set of all available routing tracks.

9. The system of claim 5, wherein blockage constraints are inserted with respect to tracks not included in the set of allowed routing tracks but included in the set of available routing tracks so that the blocked tracks are not used in association with routing the lower level block.

10. The system of claim 5, wherein the set of allowed routing tracks is selected using a modified k-means clustering algorithm.

11. The system of claim 10, wherein the modified k-means clustering algorithm is based on a cost function.

12. The system of claim 11, wherein the cost function is based at least in part on displacements of moving wires.

13. The system of claim 11, wherein the cost function is based at least in part on preferred routing tracks or areas.

14. The system of claim 1, wherein the system is further configured to iteratively re-route the second routing plan after relaxing or removing one or more routing resource constraints when the second routing plan includes an error until a fourth routing plan is achieved that does not include the error.

15. The system of claim 14, wherein DRC (Design Rule Checking) violations are permitted in association with intermediate routing plans generated during re-routing iterations but not in association with the fourth routing plan.

16. The system of claim 14, wherein wire overlapping is permitted in association with intermediate routing plans generated during re-routing iterations but not in association with the fourth routing plan.

17. The system of claim 1, wherein the first routing plan comprises a partial routing plan.

18. A computer-implemented method, comprising:
   obtaining, using the computer, a specification of a hierarchical integrated circuit design comprising a lower level block and an upper level block when the computer is invoked to route the hierarchical integrated circuit design, wherein the specification comprises a first routing plan associated with the lower level block;
   modifying, using the computer, the first routing plan using constrained routing resources so as to generate a second routing plan associated with the lower level block, the second routing plan comprising fewer routing tracks than the first routing plan and resulting in at least one unused track; and
   generating, using the computer, a third routing plan associated with the upper level block using the at least one unused track.

19. The computer-implemented method of claim 18 further comprising iteratively re-routing the second routing plan after relaxing or removing one or more routing resource constraints when the second routing plan includes an error until a fourth routing plan is achieved that does not include the error.

20. A non-transitory computer readable storage medium comprising instructions which when executed by a computer cause the computer to:

obtain a specification of a hierarchical integrated circuit design comprising a lower level block and an upper level block when the computer is invoked to route the hierarchical integrated circuit design, wherein the specification comprises a first routing plan associated with the lower level block;

modify the first routing plan using constrained routing resources so as to generate a second routing plan associated with the lower level block, the second routing plan comprising fewer routing tracks than the first routing plan and resulting in at least one unused track; and generate a third routing plan associated with the upper level block using the at least one unused track.

* * * * *